(12) United States Patent
Taguchi

(10) Patent No.: US 6,320,890 B1
(45) Date of Patent: Nov. 20, 2001

(54) LASER DRIVING CIRCUIT CAPABLE OF STABLY CONTROLLING LASER OUTPUT

(75) Inventor: Toyoki Taguchi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/493,020

(22) Filed: Jan. 28, 2000

(30) Foreign Application Priority Data

Jan. 29, 1999 (JP) .................................................. 11-022375

(51) Int. Cl.[7] .............................. H01S 3/00; H03F 3/45; H03F 3/08
(52) U.S. Cl. .................................... 372/38.02; 372/38.01; 372/38.07; 372/38.04; 330/260; 330/308
(58) Field of Search ............................. 372/38.01, 38.02, 372/38.07, 38.09; 327/108; 369/116; 330/260, 308

(56) References Cited

U.S. PATENT DOCUMENTS

Re. 35,766  4/1998  Taguchi .
5,579,329  11/1996  Taguchi .
5,848,044  12/1998  Taguchi et al. .
5,898,334  4/1999  Fairgrieve .

Primary Examiner—Frank G. Font
Assistant Examiner—Armando Rodriguez
(74) Attorney, Agent, or Firm—Oblon, Spivak, McClelland, Maier & Neustadt, P.C.

(57) ABSTRACT

An input signal is supplied to an adder circuit via a gain control amplifier and integrating amplifier and output signals of the gain control amplifier and the integrating circuit are added together by the adder circuit. An output signal of the adder circuit is supplied to a driving current generating circuit. The driving current generating circuit is constituted by first and second transistors whose bases and emitter are commonly connected. An externally attached resistor monitors a driving current flowing in the collector of the transistor constructing the driving current generating circuit and feeds back the current to the gain control amplifier. Therefore, the current control operation of high precision can be attained by use of a part of the driving current.

20 Claims, 8 Drawing Sheets

LASER DRIVING CIRCUIT CAPABLE OF STABLY CONTROLLING LASER OUTPUT

BACKGROUND OF THE INVENTION

This invention relates to a driving circuit for a semiconductor laser which is applied to an optical disk recording/reproducing apparatus using a recordable compact disk (CD-R), digital versatile disk (DVD-RAM), magneto-optic disk (MO), for example.

As the laser driving circuit applied to the above type of apparatus, an automatic power control (APC) system and automatic current control (ACC) system are provided.

FIG. 12 shows a conventional apparatus of APC system used for an MO, for example. The apparatus includes a laser driving circuit 101, a laser diode (LD) 102 constructed by a semiconductor laser, lenses 103, 105, 106, 108 constructing an optical system, a beam splitter 104, a 4-segment sensor 107, for example, for detecting reflected light from an optical disk 110 at the data readout time, and a photodiode 109 for detecting an output signal from the laser diode 102 and feeding the same back to the laser driving circuit 101. The laser driving circuit 101 controls the amount of emission light of the laser diode 102 according to a signal supplied from the photodiode 109.

FIG. 13 shows a conventional apparatus of ACC system used for CD-R or DVD-RAM, for example. The apparatus includes a laser driving circuit 111, a laser diode (LD) 112, lenses 113, 115, 116 constructing an optical system, a beam splitter 114, a 4-segment sensor 117, for example, for detecting reflected light from an optical disk 119 at the data readout time, a photodiode 118 used as a photodetector for detecting an output light amount of the laser diode 112, an amplifier 120 for amplifying an output signal of the photodiode 118 and a digital signal processing circuit 121 for processing an output signal of the amplifier 120 and supplying the processed signal to the laser driving circuit 111. The digital signal processing circuit 121 includes an analog/digital converter (A/D) 121a for converting an output signal of the amplifier 120 into a digital signal, a microprocessor unit (MPU) 121b for processing an output signal of the analog/digital converter 121a, and a digital/analog converter (D/A) 121c for converting an output signal of the microprocessor unit 121b into an analog signal. The laser driving circuit 111 controls the amount of emission light of the laser diode 112 according to a signal supplied from the digital signal processing circuit 121 by use of a current value thereof.

In the case of APC system shown in FIG. 12, a plurality of pulse signals are generated for each pit in order to form pits of good shape in the optical disk. The laser diode is driven by the pulse signals. Therefore, the laser diode 102 is driven by a high-frequency pulse signal. As a result, it is required for the photodiode 109 which monitors the light emission output of the laser diode 102 to have a wide-band characteristic of 500 MHz, for example. Further, a high-precision lens is used as the lens 108 for guiding the laser light to the photodiode 109. On the other hand, in the case of ACC system, the high-speed response in comparison with the APC system is not required. Therefore, the photodetector and optical system can be made simple in construction.

However, in the conventional ACC system shown in FIG. 13, in the laser driving circuit 111 constructed by a semiconductor integrated circuit, variations occur in resistances of resistors constructing the circuit. Further, the resistance fluctuates depending on the temperature. In addition, the transistor characteristic also fluctuates depending on the temperature. Therefore, it is difficult to stabilize the laser output with high precision.

BRIEF SUMMARY OF THE INVENTION

This invention has been made in order to solve the above problem and an object of this invention is to provide a laser driving circuit capable of stabilizing the laser output with high precision.

The above object can be attained by a laser driving circuit comprising: a first amplifier for comparing an input signal which controls a light emission intensity of a semiconductor laser with a monitor signal obtained by monitoring a driving current of the semiconductor laser and effecting the control operation to make the input signal and the monitor signal substantially equal to each other; a second amplifier connected to an output terminal of the first amplifier; an adder circuit for adding together output signals of the first and second amplifiers; a driving current generating circuit having an input terminal supplied with an output signal of the adder circuit and an output terminal configured to be connected to the semiconductor laser, for generating a driving current of the semiconductor laser according to the output signal of the adder circuit; and a terminal to which a resistor for detecting the driving current output from the driving current generating circuit and generating the monitor signal is connected.

Further, a laser driving circuit comprising: a first amplifier for comparing an input signal which controls a light emission intensity of a semiconductor laser with a feedback signal obtained by feeding back a driving current of the semiconductor laser and effecting the control operation to make the input signal and the feedback signal substantially equal to each other; a second amplifier connected to an output terminal of the first amplifier; an adder circuit for adding together output signals of the first and second amplifiers; a driving current generating circuit supplied with an output signal of the adder circuit, for generating the driving current of the semiconductor laser, at least part of the driving current being fed back to the first amplifier as the feedback signal; and a resistor connected to an input terminal of the first amplifier, for detecting the feedback signal fed back from the driving current generating circuit.

In addition, a laser driving circuit comprising: at least two converting circuits for converting at least two input signals which control a light emission intensity of a semiconductor laser to currents for generating a driving current used for driving the semiconductor laser; a current mirror circuit having an input terminal supplied with output signals of the at least two converting circuits; a current switch circuit connected to an output terminal of the current mirror circuit, for eliminating a current which is unnecessary for an operation mode of the semiconductor laser from an output signal of the current mirror circuit according to the operation mode of the semiconductor laser to generate a control current; and a driving current generating circuit having an input terminal supplied with the control current and an output terminal configured to be connected to the semiconductor laser, for generating the driving current of the semiconductor laser according to the control current.

Further, a laser driving circuit comprising: at least two converting circuits for converting at least two input signals which control a light emission intensity of a semiconductor laser to currents for generating a driving current used for driving the semiconductor laser; a current switch circuit connected to each output terminal of the at least two converting circuits, for eliminating a current which is unnecessary for an operation mode of the semiconductor laser from sum of output signals of the at least two converting circuits according to the operation mode of the semiconductor laser to generate a control current; and a driving current generating circuit having an input terminal supplied with the control current and an output terminal configured to be connected to the semiconductor laser, for generating the driving current of the semiconductor laser according to the control current.

According to the laser driving circuit of this invention, the laser output can be stabilized with high precision without being influenced by fluctuations in the resistances of the internal circuit and variations in the resistances due to a temperature change.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

There will now be described embodiments of this invention with reference to the accompanying drawings.

(First Embodiment)

Figure 1:
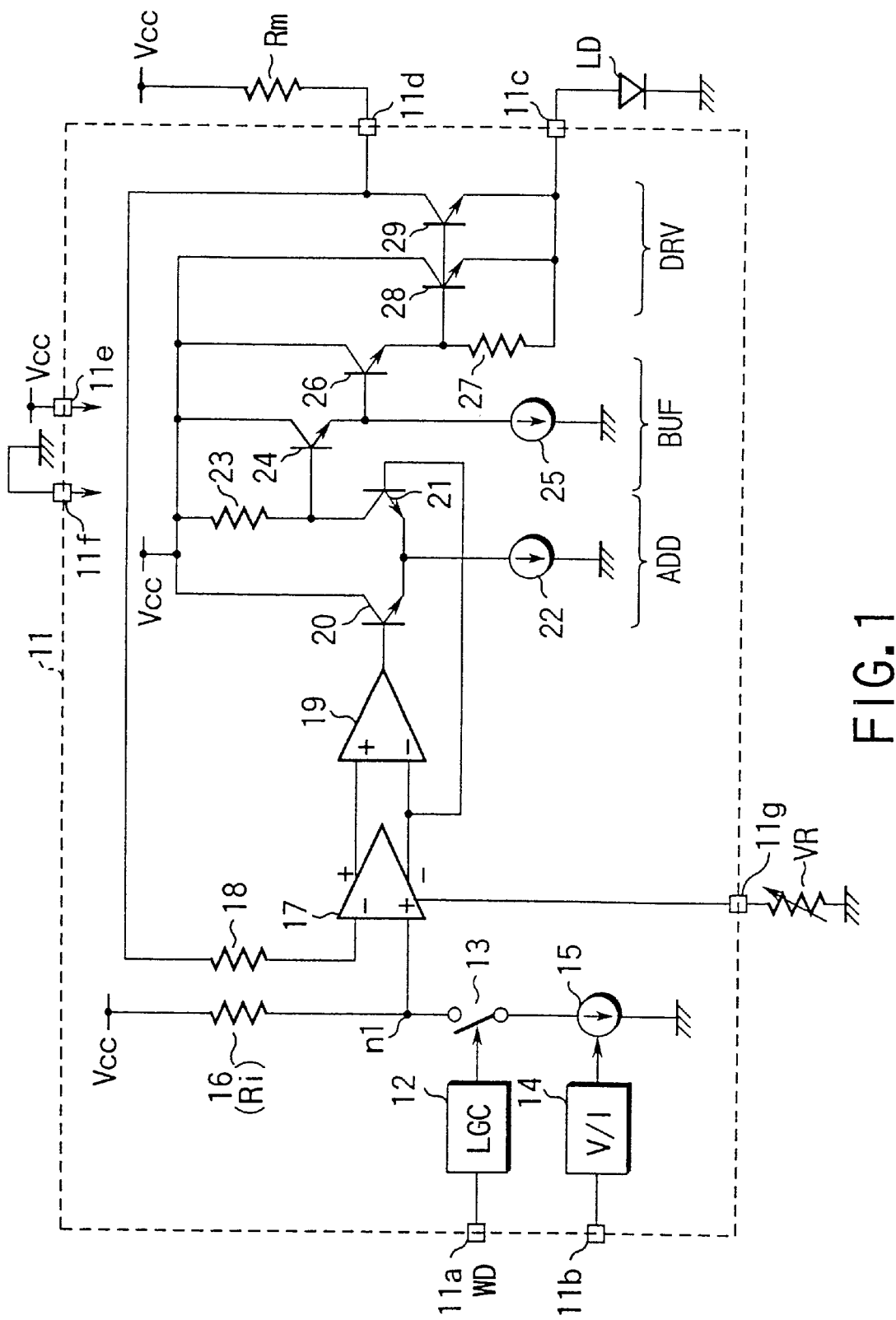
FIG. 1 is a circuit diagram showing a first embodiment of this invention.
Figure 13:
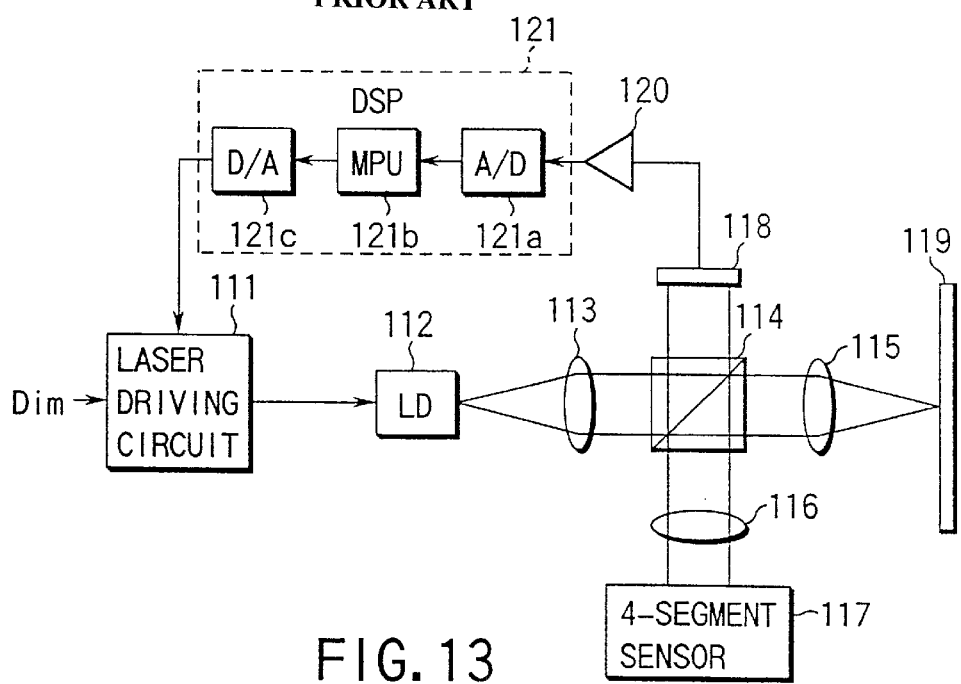
FIG. 13 is a construction diagram showing another example of a conventional laser driving circuit.

FIG. 1 shows a first embodiment of a laser driving circuit according to this invention. The circuit is applied to the ACC system shown in FIG. 13. In FIG. 1, a laser driving circuit 11 has pads 11a to 11g. Write data WD is supplied to the pad 11a. A control signal from the digital signal processing circuit 121 shown in FIG. 13 is supplied to the pad 11b. A laser diode LD constructed by a semiconductor laser is connected between the pad 11c and the ground node. A resistor Rm is connected between the pad 11d and a power supply Vcc. The resistor Rm is an externally attached monitoring resistor for monitoring a current flowing in the laser diode LD. The pad 11e is connected to the power supply Vcc and the pad 11f is grounded. To the pad 11g, a variable resistor VR for controlling the gain of a gain control amplifier which will be described later is connected.

The input terminal of a logic circuit (LGC) 12 is connected to the pad 11a. The logic circuit 12 includes a level converting circuit, for example, and converts the write data WD of TTL level into a signal of ECL level. The output terminal of the logic circuit 12 controls a switch circuit 13. A voltage/current converting circuit (V/I) 14 is connected to the pad 11b. The voltage/current converting circuit 14 converts a control signal of voltage level supplied from the digital signal processing circuit 121 to a current. An output current of the voltage/current converting circuit 14 is supplied to a current source 15 to control the current of the current source 15. The switch circuit 13 and current source 15 are serially connected between the power supply Vcc and the ground node together with a resistor 16.

A connection node n1 of the switch circuit 13 and the resistor 16 is connected to the non-inverting input terminal of a gain control amplifier 17. A monitor voltage is supplied from a transistor 29 which will be described later to the inverting input terminal of the gain control amplifier 17 via a resistor 18. An output signal of the gain control amplifier 17 is supplied to the input terminal of an integrating amplifier 19 constructed by an operational amplifier. The output terminal of the integrating amplifier 19 is connected to the base of an NPN transistor 20. The collector of the transistor 20 is connected to the power supply Vcc and the emitter thereof is grounded via a constant current source 22 together with the emitter of a transistor 21. The base of the transistor 21 is connected to the inverting output terminal of the gain control amplifier 17 and the collector thereof is connected to the power supply Vcc via a resistor 23. The transistors 20, 21, constant current source 22 and resistor 23 constitute an adder circuit ADD for adding together a current output from the inverting output terminal of the gain control amplifier 17 and a current output from the integrating amplifier 19.

A connection node of the collector of the transistor 21 and the resistor 23 is connected to the base of a transistor 24. The collector of the transistor 24 is connected to the power supply Vcc and the emitter thereof is grounded via a constant current source 25. Further, the emitter of the transistor 24 is connected to the base of a transistor 26. The collector of the transistor 26 is connected to the power supply Vcc and the emitter thereof is connected to the pad 11c via a resistor 27 and to the bases of transistors 28, 29. The collector of the transistor 28 is connected to the power supply Vcc and the emitter thereof is connected to the pad 11c. The collector of the transistor 29 is connected to the pad 11d and to the inverting input terminal of the gain control amplifier 17 via the resistor 18 and the emitter thereof is connected to the pad 11c. The sizes of the transistors 28 and 29 are made equal to each other. The transistor 29 causes half of the driving current to flow through the resistor Rm to derive a monitor signal. The transistors 24, 26, constant current source 25 and resistor 27 constitute a buffer circuit BUF and the transistors 28, 29 constitute a driving circuit DRV.

The gain control amplifier 17, integrating amplifier 19 and adder circuit ADD constitute a wide-band amplifier. The wide band amplifier advances the phase in the high-frequency range to compensate for the phase delay caused by the resistor Rm connected to the pad 11d and a parasitic capacitor (not shown) connected to the pad 11d.

Further, a photodiode (not shown) used as a photodetector is arranged near the laser diode LD. The light emission intensity of the laser diode LD is detected by use of the photodiode. The light emission intensity detected is processed by a digital signal processing circuit (not shown) and then supplied to the pad 11b. The photodiode and digital signal processing circuit have substantially the same constructions as those in the conventional case.

With the above construction, write data WD input to the pad 11a is supplied to the switch circuit 13 via the logic circuit 12 in the data writing mode, for example. Further, a voltage corresponding to the light emission intensity of the laser diode LD is supplied to the pad 11b. The voltage is supplied to the constant current source 15 via the voltage/current converting circuit 14. The potential of the connection node n1 is determined by the current flowing in the constant current source 15. The gain control amplifier 17 compares the potential of the connection node n1 with the voltage converted from the driving current of the laser diode LD which is detected by the monitoring resistor Rm so as to effect the control operation to make them equal to each other. The output voltage of the gain control amplifier 17 is supplied to the driving circuit DRV via the integrating amplifier 19, adder circuit ADD and buffer circuit BUF. The buffer circuit BUF and driving circuit DRV constitute a driving current generating circuit and the driving circuit DRV drives the laser diode LD according to an output signal of the buffer circuit BUF.

Figure 2:
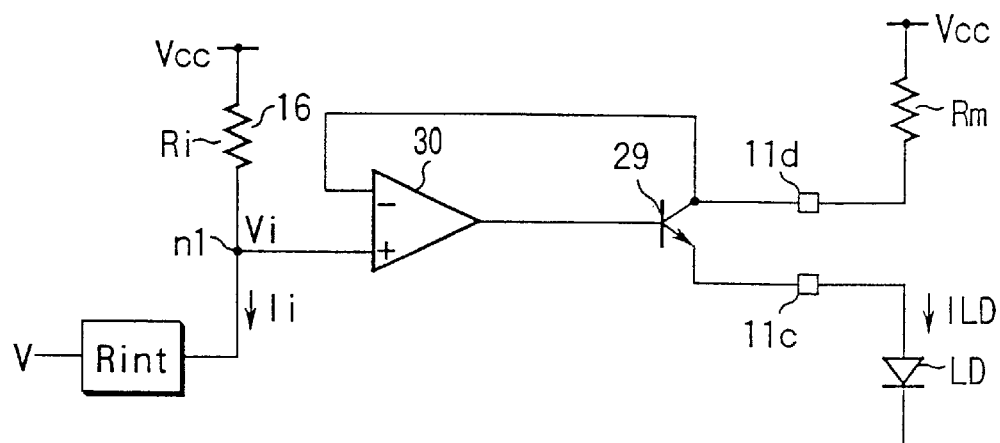
FIG. 2 is an equivalent circuit diagram schematically showing the circuit of FIG. 1.

FIG. 2 shows an equivalent circuit of the circuit shown in FIG. 1 and portions which are the same as those of FIG. 1 are denoted by the same reference numerals. An amplifier 30 is equivalent to a combination of the gain control amplifier 17, integrating amplifier 19, transistors 20, 21, 24, and 26 and resistor R23, all shown in FIG. 1. If an input voltage supplied to the amplifier 30 is Vi, an input current is Ii and the resistance of the resistor 16 is Ri, then the input voltage Vi can be expressed by the following equation (1). In addition, the voltage in the following equations (1) to (12) dose not show an absolute value.

$$Vi = Ri(1+\Delta R) \times Ii \quad (1)$$

If an input voltage to the integrating circuit is V, the internal resistance is R and the variation component thereof is ΔR, then the current Ii can be expressed by the following equation.

$$Ii = V/R(1+\Delta R) \quad (2)$$

Further, if the driving current flowing in the laser diode LD is $I_{LD}$ and the terminal voltage of the resistor Rm is set to an output voltage Vo, then the output voltage Vo can be expressed by the following equation (3).

$$Vo = Rm \times I_{LD} \quad (3)$$

As described before, the amplifier 30 is operated to make the input voltage Vi and output voltage Vo equal to each other. Therefore, the relation of Vi=Vo can be attained. As a result, the driving current $I_{LD}$ can be rewritten into the following equation (4) based on the equations (1), (2), (3).

$$I_{LD} = V \cdot Ri / Rm \cdot R \quad (4)$$

Thus, the error component ΔR of the resistance can be eliminated, and the variations of the internal resistance can be compensated. The resistance of the resistor Rm provided outside the integrated circuit can be set with high precision. Therefore, a laser output having no variations of the internal resistance can be obtained by use of the resistor Rm.

According to the first embodiment, the sizes of the transistors 28, 29 constituting the driving circuit DRV are set equal to each other and half of the driving current $I_{LD}$ which flows into the collector of the transistor 29 is monitored by use of the resistor Rm and fad back to the gain control amplifier 17. Therefore, the current control can be attained with high precision by use of a driving current which is 2Ri/Rm times the set current.

Since the output signals of the gain control amplifier 17 and integrating amplifier 19 are added together by the adder circuit ADD, the phase can be advanced in the high-frequency region. Therefore, the phase delay caused by the resistor Rm and parasitic capacitor can be suppressed and the wide-band control of 300 MHz or higher can be attained.

The current flowing in the laser diode LD is monitored by use of the externally attached resistor Rm and a variation in the resistance of the internal resistor in the manufacturing process and a variation thereof due to the temperature change can be compensated for. Therefore, the laser output can be stabilized with high precision.

In addition, a current flows in the externally attached resistor Rm only when the laser diode LD is driven and does not normally flow therein. Therefore, the power consumption can be suppressed.

(Second Embodiment)

Figure 3:
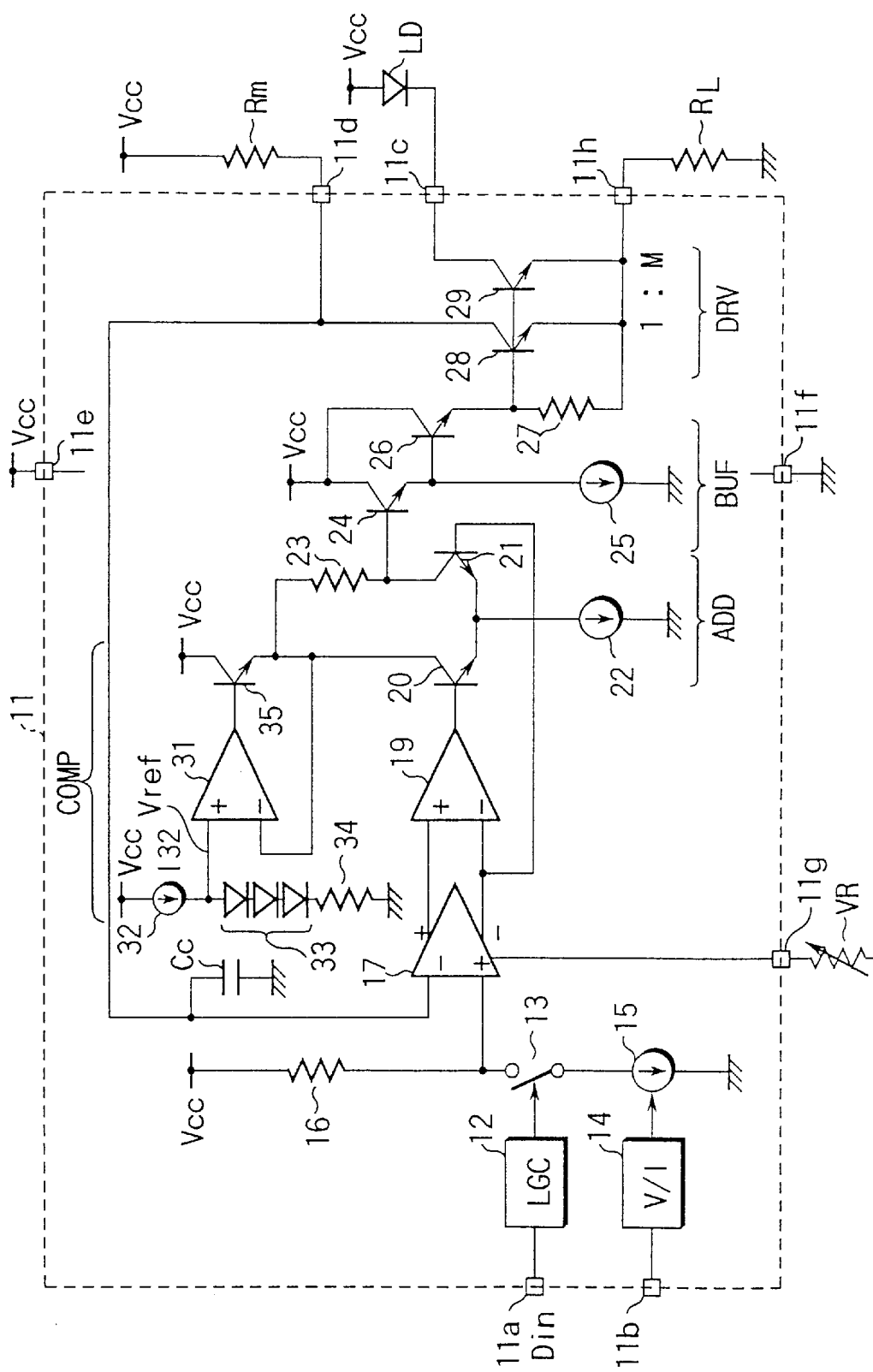
FIG. 3 is a circuit diagram showing a second embodiment of this invention.

FIG. 3 shows a second embodiment of this invention. In FIG. 3, portions which are the same as those of FIG. 1 are denoted by the same reference numerals and only different portions are explained.

The characteristics of the transistors 28, 29 (the size ratio is set to 1:M constituting the driving circuit DRV are changed according to variations in the power supply voltage Vcc and the temperature and the driving current generated therefrom varies. In the second embodiment, a variation in the driving current generated from the buffer circuit BUF and driving circuit DRV is compensated for.

In the laser driving circuit 11 shown in FIG. 3, the cathode of the laser diode LD is connected to the pad 11c and the anode thereof is connected to the power supply Vcc. That is, in this embodiment, for example, an anode common type laser diode in which the anode of the laser diode LD is connected to the cathode of a photodiode (not shown) is used. The pad 11c is connected to the collector of a transistor 29 whose emitter is connected to a pad 11h. The pad 11h is grounded via a load resistor $R_L$. The pad 11d to which an externally attached monitoring resistor Rm is connected is connected to the collector of a transistor 28. The collector of the transistor 28 is connected to the inverting input terminal of the gain control amplifier 17. The inverting input terminal is grounded via a capacitor Cc.

The size of the transistor 29 is set to M times the size of the transistor 28. Therefore, in this embodiment, the resistor Rm monitors a current which is 1/M times the current flowing in the laser diode LD.

A compensation circuit COMP is connected to the adder circuit ADD. The compensation circuit COMP includes an operational amplifier 31, constant current source 32, a plurality of diodes 33, resistor 34 and transistor 35. The diode group 33 generates a voltage corresponding to the total sum of base-emitter voltages of the three transistors 24, 26, 29. The constant current source 32, plurality of diodes 33 and resistor 34 are serially connected between the power supply Vcc and the ground node. The connection node of the constant current source 32 and the diode group 33 is connected to the non-inverting input terminal of the operational amplifier 31. The output terminal of the operational amplifier 31 is connected to the base of the transistor 35. The collector of the transistor 35 is connected to the power supply Vcc and the emitter thereof is connected to the collector of the transistor 20 and the inverting input terminal of the operational amplifier 31.

With the above construction, the constant current source 32, plurality of diodes 33 and resistor 34 create a temperature-compensated reference voltage Vref for the transistors 24, 26, 29. The reference voltage vref can be expressed by the following equation if a current flowing in the constant current source 32 is $I_{32}$, a voltage generated from the diode group 33 is $3V_F$ and the resistance of the resistor 34 is $R_{34}$.

$$V\text{ref} = I_{32} \cdot R_{34} + 3V_F \qquad (5)$$

The operational amplifier 31 is operated to make the emitter voltage of the transistor 35 or the power supply voltage of the adder circuit ADD and the reference voltage Vref equal to each other. Therefore, the adder circuit ADD outputs a temperature-compensated signal. Since the buffer circuit BUF and driving circuit DRV are operated by the temperature-compensated signal, a variation in the driving current due to the temperature change can be prevented.

According to the second embodiment, the same effect as that of the first embodiment can be attained. Further, according to the second embodiment, a variation in the driving current of the buffer circuit BUF and driving circuit DRV due to the temperature change can be prevented by temperature-compensating for the output signal of the adder circuit ADD by use of the compensation circuit COMP. Therefore, the laser diode LD can be controlled with high precision irrespective of the temperature change.

The compensation circuit COMP is provided in a portion other than the feedback loop connecting the driving circuit DRV and the gain control circuit 17. If the compensation circuit COMP is provided in the feedback loop, it becomes necessary to increase currents flowing in the transistors 20, 21 constituting the adder circuit ADD. However, currents flowing in the transistors 20, 21 can be reduced by providing the compensation circuit COMP in a portion other than the feedback loop as in this embodiment.

(Third Embodiment)

Figure 4:
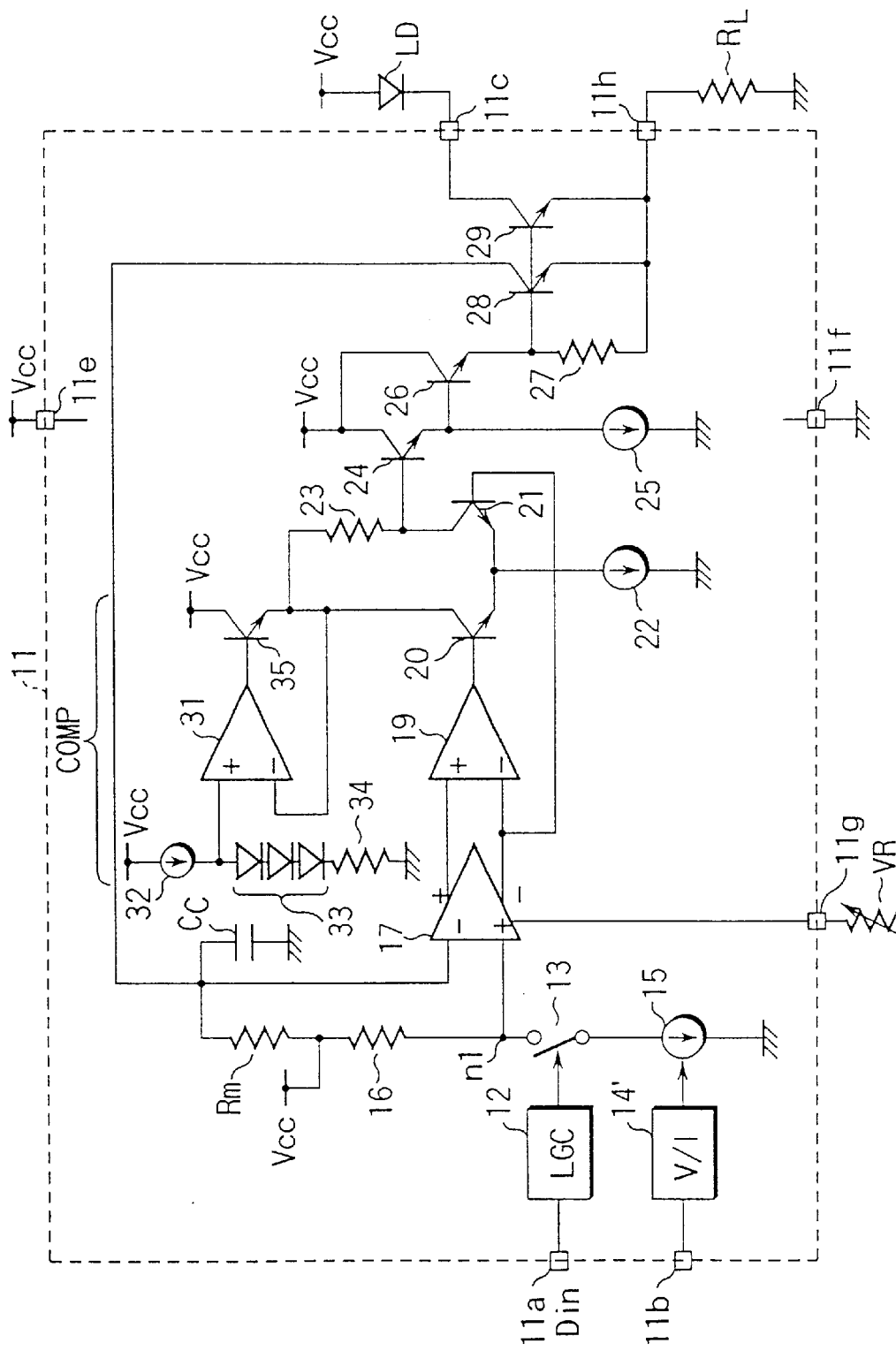
FIG. 4 is a circuit diagram showing a third embodiment of this invention.

FIG. 4 shows a third embodiment of this invention. In FIG. 4, portions which are the same as those of FIG. 3 are denoted by the same reference numerals and only different portions are explained. In the second embodiment, the driving current is set by use of the voltage value and the externally attached monitoring resistor Rm is connected to the exterior of the laser driving circuit 11. However, in this embodiment, since the driving current is set by use of the current value, the monitoring resistor Rm is provided inside the laser driving circuit 11. That is, one end of the resistor Rm is connected to the power supply Vcc and the other end thereof is connected to the inverting input terminal of the gain control amplifier 17. Further, a current/current converter 14' constructed by one transistor, for example, for converting a current value is connected between the pad 11b and a constant current source 15. The reason why the monitoring resistor Rm is arranged inside the IC is explained below in detail.

Figure 5:
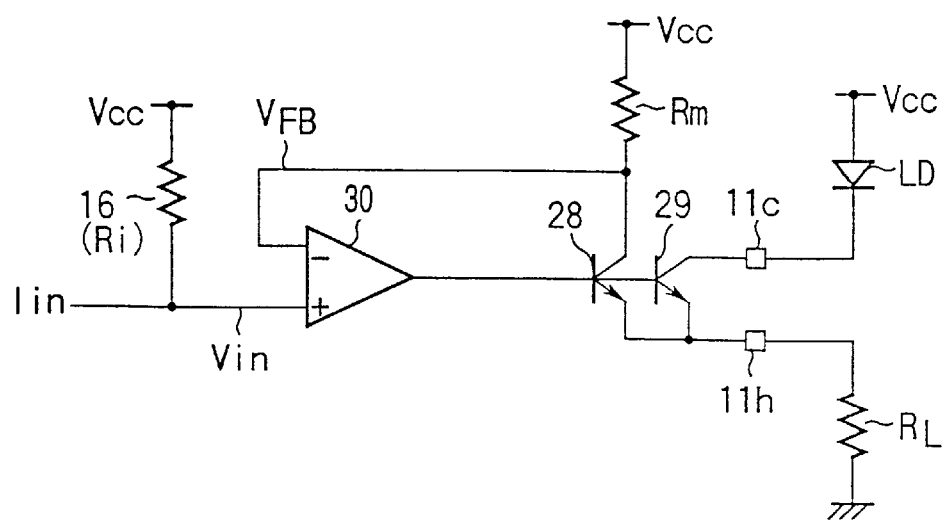
FIG. 5 is an equivalent circuit diagram schematically showing the circuit of FIG. 4.

FIG. 5 shows the schematic equivalent circuit of the circuit shown in FIG. 4. If a driving current fed back by a transistor 28 is $I_{LD}/N$ and an error component of the resistor in the semiconductor integrated circuit is ΔR, then a voltage $V_{FB}$ supplied to the inverting input terminal of the gain control amplifier 17 can be expressed by the following equation.

$$V_{FB} = I_{LD} \times Rm(1+\Delta R)/N \qquad (6)$$

Further, if an input current supplied to the non-inverting input terminal of the gain control amplifier 17 is Iin and the resistance of the resistor 16 is Ri, a voltage Vin of the non-inverting input terminal of the gain control amplifier 17 can be expressed by the following equation.

$$V\text{in} = I\text{in} \times Ri(1+\Delta R) \qquad (7)$$

Since the gain control amplifier 17 is operated to make the voltage Vi and the voltage $V_{FB}$ equal to each other, the following equation (8) can be attained based on the equations (6), (7).

$$V_{FB} = V\text{in } I\text{in} \times Ri(1+\Delta R) = I_{LD} \times Rm(1+\Delta R)/N \; I_{LD} = I\text{in} \times Ri(1+\Delta R) \times N/Rm(1+\Delta R) \; I_{LD} = I\text{in} \cdot N \cdot Ri/Rm \qquad (8)$$

As is understood from the equation (8), the error component ΔR of the resistor can be eliminated by containing the resistor Rm. Therefore, a variation in the internal resistance can be compensated for by use of the circuit shown in FIG. 4 and the output of the laser diode LD can be stabilized with high precision.

(Fourth Embodiment)

Figure 6:
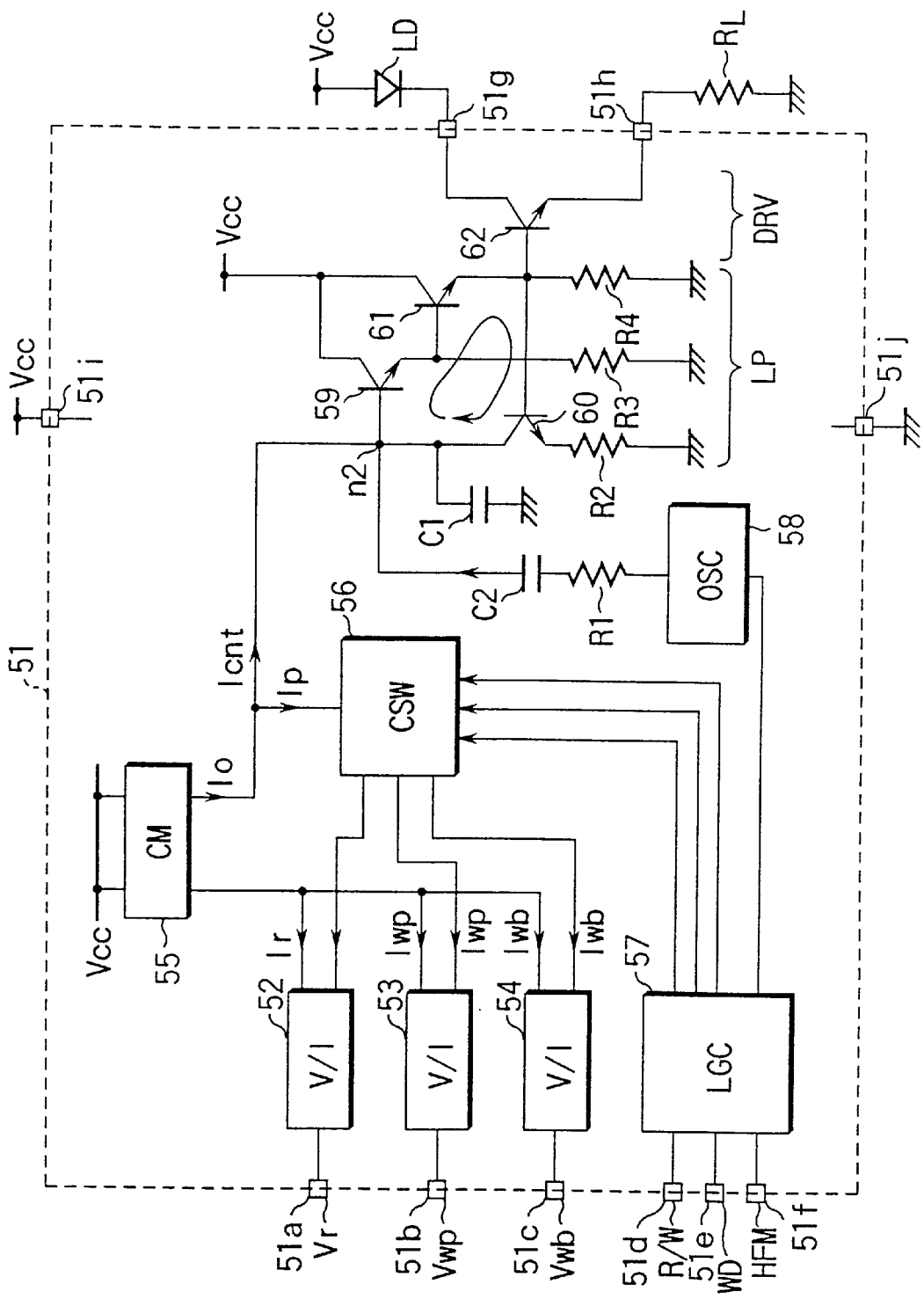
FIG. 6 is a circuit diagram showing a fourth embodiment of this invention.

FIG. 6 shows a fourth embodiment of this invention. A laser driving circuit 51 includes pads 51a to 51j. The pad 51a is supplied with a voltage Vr at the data readout time. The pad 51b is supplied with a peak voltage (maximum voltage) Vwp at the data write time and the pad 51c is supplied with a bottom voltage (minimum voltage) Vwb at the data write time. The voltages Vr, Vwp, Vwb are generated from the digital signal processing circuit (DSP) and used as signals for controlling the DSP according to the light emission intensity of the laser diode LD. Further, the pad 51d is supplied with a read/write signal R/W and the pad 51e is supplied with write data WD. The pad 51f is supplied with a signal HFM for controlling the operation of an oscillation circuit (OSC) 58 which will be described later.

Further, the laser diode LD is connected between the pad 51g and the power supply Vcc. The laser diode LD is an anode common type diode whose anode is connected to the cathode of a photodiode (not shown). An externally attached resistor $R_L$ is connected between the pad 51h and the ground node, the pad 51i is connected to the power supply Vcc and the pad 51j is grounded.

The pads 51a, 51b, 51c are respectively connected to the input terminals of voltage/current converting circuits (V/I) 52, 53, 54. The voltage/current converting circuit 52 converts the voltage Vr in the readout mode into a current Ir. The voltage/current converting circuit 53 converts the peak voltage Vwp in the write mode into a current Iwp. The voltage/current converting circuit 54 converts the bottom voltage Vwb in the write mode into a current Iwb. One-side output terminals of the voltage/current converting circuits 52 to 54 are connected to the input terminal of a current mirror circuit (CM) 55 and the other output terminals thereof are connected to a current switch circuit (CSW) 56. The current switch circuit 56 is also connected to the output terminal of the current mirror circuit 55 and the output terminals of a logic circuit 57. The current switch circuit 56 extracts a preset current from the output current Io of the current mirror circuit 55 according to an output signal of the logic circuit 57 to generate a control current Icnt.

The logic circuit (LGC) 57 is connected to the pads 51d, 51e, 51f. The logic circuit 57 generates signals for controlling the oscillation circuit (OSC) 58 and the current switch circuit 56 according to the read/write signal R/W, write data WD, signal HFM. Output signals of the logic circuit 57 are supplied to the current switch circuit 56 and oscillation circuit 58. The oscillating operation and interruption thereof in the oscillation circuit 58 are controlled by an output signal of the logic circuit 57. The oscillation circuit 58 outputs a high-frequency signal having a frequency of 300 MHz, for example. The high-frequency signal is supplied to a connection node n2 to which the base of an NPN transistor 59 and the collector of an NPN transistor 60 are connected via a resistor R1 and capacitor C2 and superposed on a control signal Icnt from the current mirror circuit 55.

The control signal Icnt from the current mirror circuit 55 is supplied to the connection node n2 to which the base of the NPN transistor 59 and the collector of the NPN transistor 60 are connected. The collector of the NPN transistor 60 is grounded via a capacitor C1 and the emitter thereof is grounded via a resistor R2. The output terminal of the oscillation circuit 58 is connected to the base of the NPN transistor 59 via the resistor R1 and capacitor C2. The collector of the transistor 59 is connected to the power supply Vcc together with the collector of a transistor 61. The emitter of the transistor 59 is grounded via a resistor R3 and connected to the base of the NPN transistor 61. The emitter of the transistor 61 is grounded via a resistor R4 and connected to the base of the transistor 60 and the base of a transistor 62. The collector of the transistor 62 is connected to the pad 51g and the emitter thereof is connected to the pad 51h.

The transistor 62 constitutes a driving circuit DRV. The transistors 59, 60 and 61 constitute a loop LP. Further, the loop LP and the driving circuit DRV constitute a driving current generating circuit. The loop LP effects the control operation to make the collector current of the transistor 60 and the current Icnt equal to each other. The capacitors C1, C2, resistor R1 construct a compensation circuit for preventing oscillation of the loop.

Figure 7A:
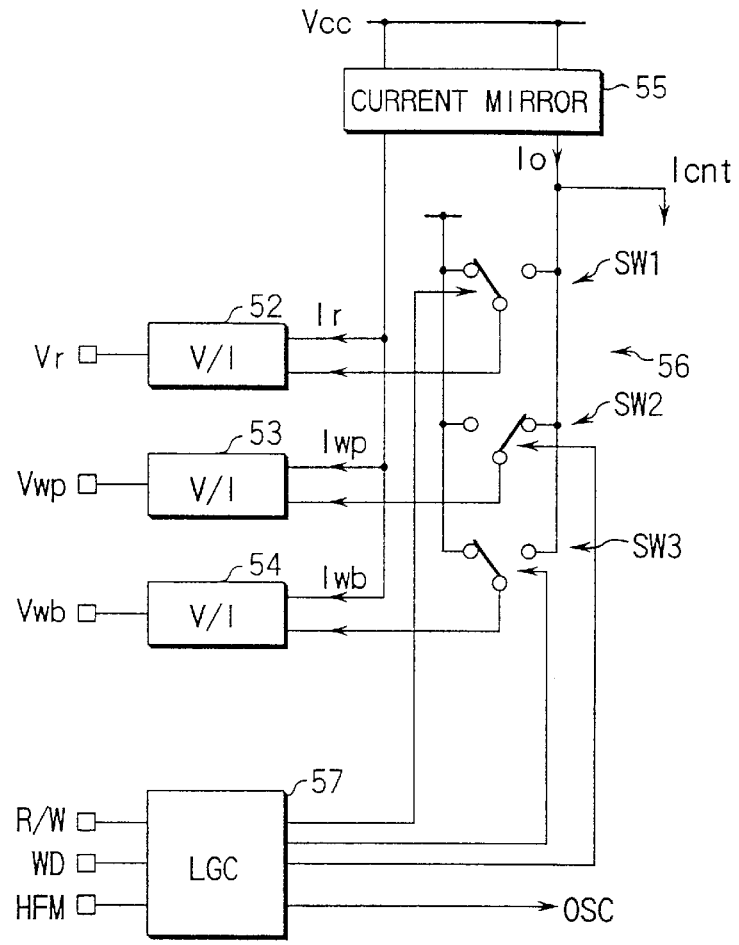
FIG. 7A is a construction diagram schematically showing a current switch circuit.

FIG. 7A schematically shows the construction of the current switch circuit 56. The current switch circuit 56 includes a plurality of switches SW1, SW2, SW3 for extracting preset currents from the output current Io of the current mirror circuit 55. One end of each of the switches SW1, SW2, SW3 is connected to one of the output terminals of a corresponding one of the voltage/current converting circuits 52, 53, 54 and the other end thereof is commonly connected to the output terminal of the current mirror circuit 55. The switching states of the switches SW1, SW2, SW3 are changed by the output signals of the logic circuit 57 to selectively extract selected amounts of currents from the output signal Io of the current mirror circuit 55. FIG. 7A shows a case wherein the current Iwp is extracted from the output signal Io of the current mirror circuit 55. Therefore, in this case, the control current Icnt is equal to Ir+Iwb.

Figure 7B:
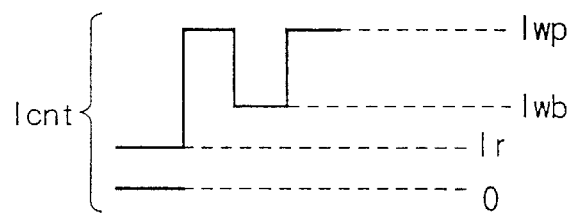
FIG. 7B is a waveform diagram showing one example of a control current Icnt.

FIG. 7B shows one example of the control current Icnt. The control current Icnt has a level corresponding to the voltages Vr, Vwp, Vwb.

With the above construction, the voltage/current converting circuits 52, 53, 54 output currents Ir, Iwp, Iwb corresponding to the voltages Vr, Vwp, Vwb. The currents Ir, Iwp, Iwb are supplied to the input terminal of the current mirror circuit 55 and Io (=Ir+Iwp+Iwb) is output from the output terminal of the current mirror circuit 55. The current switch circuit 56 is operated according to the output signal of the logic circuit 57 so as to extract an unnecessary current from the output current of the current mirror circuit 55 at data write time or data readout time and generate a control current Icnt. The control current Icnt is supplied to the connection node n2 of the base of the transistor 59 and the collector of the transistor 60. Further, a high-frequency signal supplied from the oscillation circuit 58 is superposed in the connection node n2. A signal having the high-frequency signal superposed thereon is amplified by the transistors 59, 60, 61 and supplied to the base of the transistor 62. The laser diode LD is driven by the transistor 62.

If a current flows in the resistor, electrons are drifted by the resistance thereof to cause noise called thermal noise. In order to reduce the noise, it is important to reduce the resistance of the resistor. For example, when a current flows in the laser diode LD, the noise occurring in the laser diode LD can be suppressed by reducing the input impedance of the transistor 62. That is, the noise contained in the driving current of the laser diode LD can be suppressed by reducing the resistance of the resistor R4 connected to the base of the transistor 62.

Figure 8:
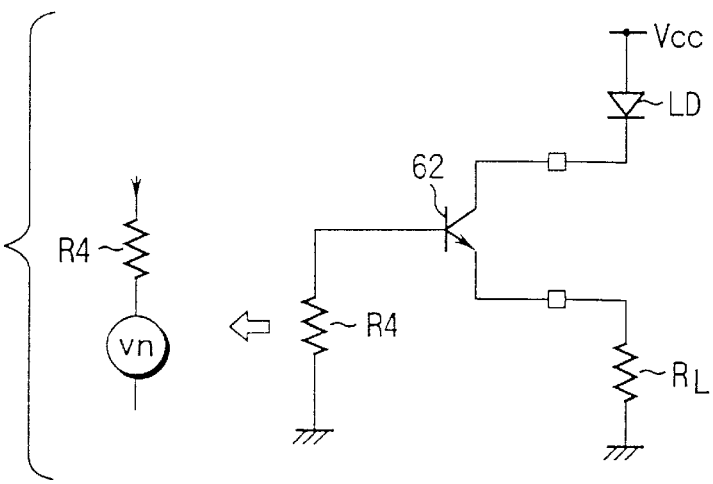
FIG. 8 is an equivalent circuit diagram showing the driving circuit of FIG. 6.

FIG. 8 shows the equivalent circuit of the driving circuit DRV of FIG. 6. That is, the input voltage of the transistor 62 contains thermal noise Vn which is expressed as follows.

$$Vn = 4kTR^{1/2} \tag{9}$$

where k is a Bolzmann's constant, T is a thermodynamic temperature and R is the resistance of the resistor R4.

The current $I_{LD}$ flowing in the laser diode LD can be roughly expressed by the following equation if the current amplification factor of the transistor is neglected and the voltage of the pad 51h is Ve.

$$I_{LD} = Ve/R_L + Vn/R_L \tag{10}$$

Therefore, in order to reduce the noise, it is important to reduce Vn, and in the fourth embodiment, the resistance of the resistor R4 is set to 200 Ω or less, for example, 100 Ω. With this construction, the noise current density for 1 Hz can be suppressed to 1 nA/Hz$^{1/2}$ or less and if the driving current is 50 mA with 1 nA, RIN (relative noise field intensity ratio) can be set to −154 dB/Hz. The value satisfies enough RIN ≦−40 dB/Hz usually demanded.

The relation between the control current Icnt and the current $I_{LD}$ flowing in the laser diode LD can be expressed by the following equation (11).

$$Icnt \cdot R2(1+\Delta R)/R_L = I_{LD} \tag{11}$$

Therefore, the control current Icnt can be expressed by the following equation (12).

$$Icnt = Vin/R(1+\Delta R) \tag{12}$$

where Vin is an input voltage to the laser driving circuit 51 and R(1+ΔR) is an internal resistance and an error component thereof.

The following equation (13) can be obtained by substituting the equation (12) into the equation (11).

$$I_{LD} = Vin/R(1+\Delta R) \cdot R2(1+\Delta R)/R_L = Vin \cdot R2/R_L \cdot R(R2/R_L \text{ is a mirror ratio}) \tag{13}$$

According to the present embodiment, the current $I_{LD}$ of the laser diode LD with respect to the input voltage Vin can be easily set by changing the resistance of the resister $R_L$ that is externally connected. Further, the resistance of the $R_L$ can be set at a desired value with high precision, regardless of the error component ΔR in the integrated circuit. Hence, a laser output can be obtained, not influenced by the variation of the internal resistance.

Further, in the circuit shown in FIG. 6, the transistors 59, 60 and 61 constitute a loop to feedback a current of the transistor 60 to the base of the transistor 59 in the current mode. If the loop is thus constituted by the transistors 59, 60, 61, there occurs a possibility that phase shift occurs to cause oscillation. Therefore, in this embodiment, the oscillation is prevented by use of the capacitor C1 connected to the connection node n2 and the capacitor C2 used as the coupling capacitor. The resultant capacitance C0 of the capacitors C1 and C2 becomes equal to (C1+C2).

If an attempt is made to prevent the oscillation only by use of the capacitor C1, the area of the capacitor C1 becomes large and the occupancy ratio thereof in the integrated circuit becomes high. However, by causing the capacitor C2 used as the coupling capacitor to have the oscillation preventing function as in this embodiment, an increase in the area of the capacitor C1 can be suppressed and the integrated circuit can be prevented from being made large.

Figure 9:
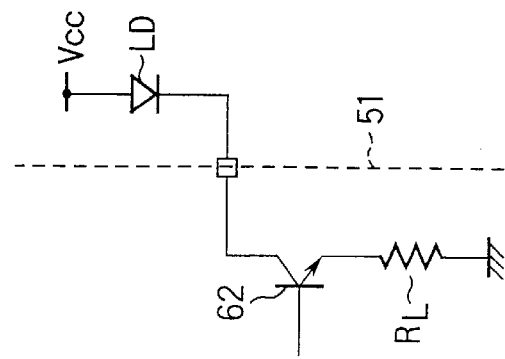
FIG. 9 is a circuit diagram showing the main portion of a modification of FIG. 6.

The circuit shown in FIG. 6 is a voltage input type circuit. On the other hand, in the case of a current input type circuit, the resistor $R_L$ may be provided inside the integrated circuit as shown in FIG. 9. In this case, an input current is subjected to the current/current conversion according to the ratio of the internal resistances.

(Fifth Embodiment)

Figure 10:
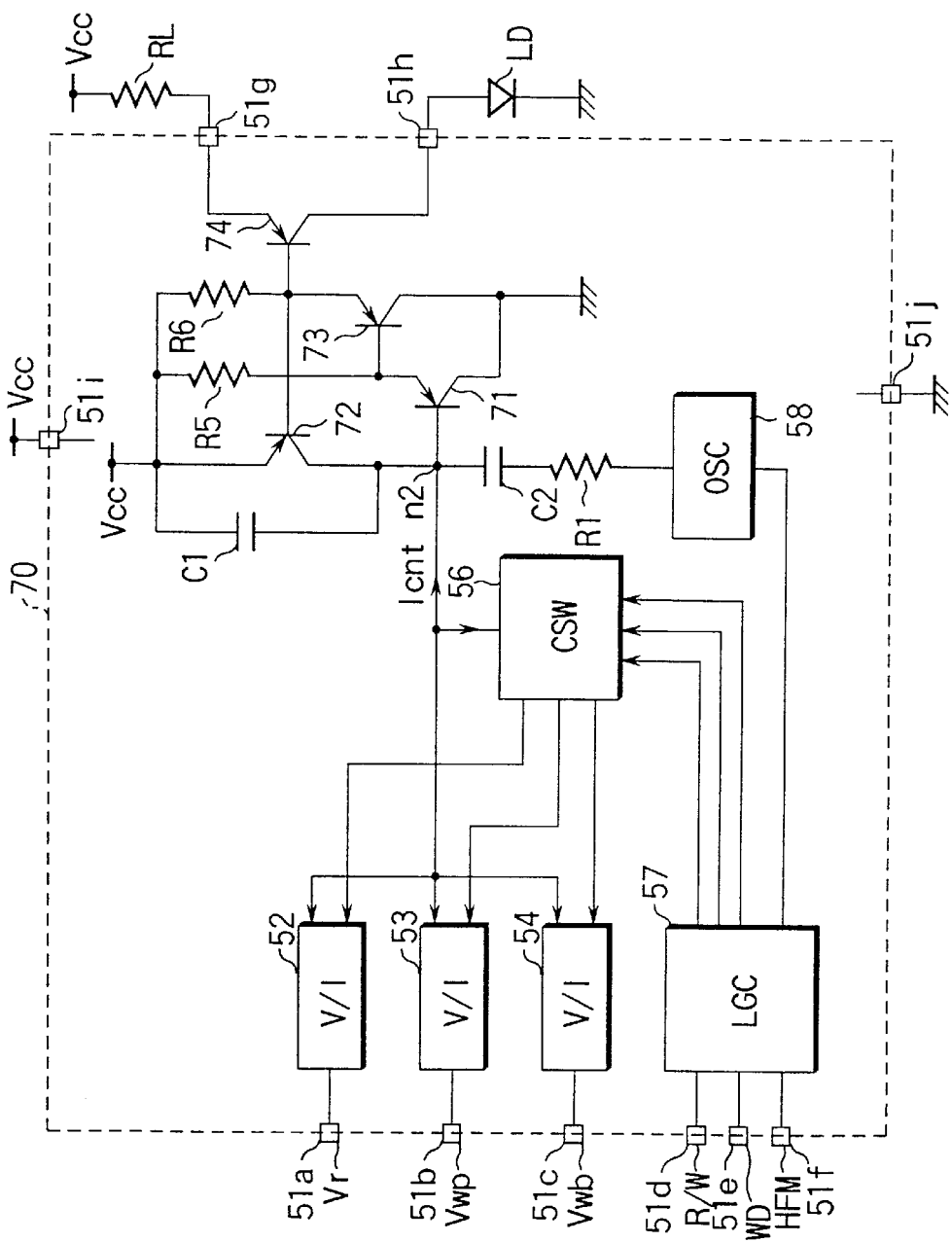
FIG. 10 is a circuit diagram showing a fifth embodiment of this invention.

FIG. 10 shows a fifth embodiment of this invention. In this embodiment, the circuit shown in FIG. 6 is constructed by use of PNP transistors and the embodiment indicates a voltage input/current output type laser driving circuit. In FIG. 10, portions which are the same as those of FIG. 6 are denoted by the same reference numerals and only different portions are explained.

A high-frequency signal output from an oscillation circuit 58 is supplied to a connection node n2 to which the base of a PNP transistor 71 and the collector of a PNP transistor 72 are connected via a resistor R1, capacitor C2. The connection node n2 is connected to the output terminals of voltage/current converting circuits 52, 53, 54 and the input terminal of a current switch 56. In a laser driving circuit 70, the current mirror circuit becomes unnecessary.

The collector of the transistor 72 is connected to the power supply Vcc via a capacitor C1 and the emitter thereof is connected to the power supply Vcc. The collector of the transistor 71 is grounded together with the collector of a PNP transistor 73. The emitter of the transistor 71 is connected to the power supply Vcc via a resistor R5 and connected to the base of the transistor 73. The emitter of the transistor 73 is connected to the power supply Vcc via a resistor R6 and connected to the base of the transistor 72 and the base of a transistor 74. The emitter of the transistor 74 is connected to a pad 51g and the collector thereof is connected to a pad 51h. An externally attached resistor $R_L$ is connected between the pad 51g and the power supply and a laser diode LD is connected between the pad 51h and the ground node. The laser diode LD is a cathode common type diode whose cathode is connected to the anode of a photodiode (not shown).

The transistor 74 constructs a driving circuit, the transistors 71, 72, 73 construct a loop and the loop effects the control operation to make the current Icnt and the collector current of the transistor 72 equal to each other. The capacitors C1, C2 and resistor R1 constitute a compensation circuit for preventing oscillation of the loop.

With the above construction, the voltage/current converting circuits 52, 53, 54 generate currents Ir, Iwp, Iwb corresponding to input voltages Vr, Vwp, Vwb. The current switch 56 extracts an unnecessary current from the currents Ir, Iwp, Iwb according to an output signal of a logic circuit 57 to generate a control current Icnt. The control current Icnt is supplied to the connection node n2 of the base of the transistor 71 and the collector of the transistor 72. Further, a high-frequency signal supplied from the oscillation circuit 58 is superposed in the connection node n2. A signal having the high-frequency signal superposed thereon is amplified by the transistors 71, 72, 73 and supplied to the base of a transistor 74 which in turn drives the laser diode LD.

In the above fifth embodiment, the same effect as that of the fourth embodiment can be attained. In addition, in the case of this embodiment, since the current mirror circuit is unnecessary unlike the fourth embodiment, the circuit construction can be made simple and the cost can be lowered.

Further, in the case of the fifth embodiment, the high-speed operation can be attained by forming the transistors 71 to 74 by use of vertical PNP transistors.

Figure 11:
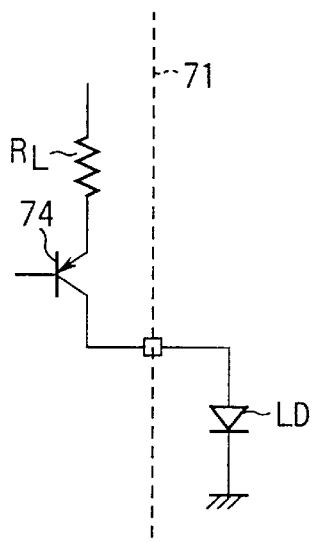
FIG. 11 is a circuit diagram showing the main portion of a modification of FIG. 10.
Figure 12:
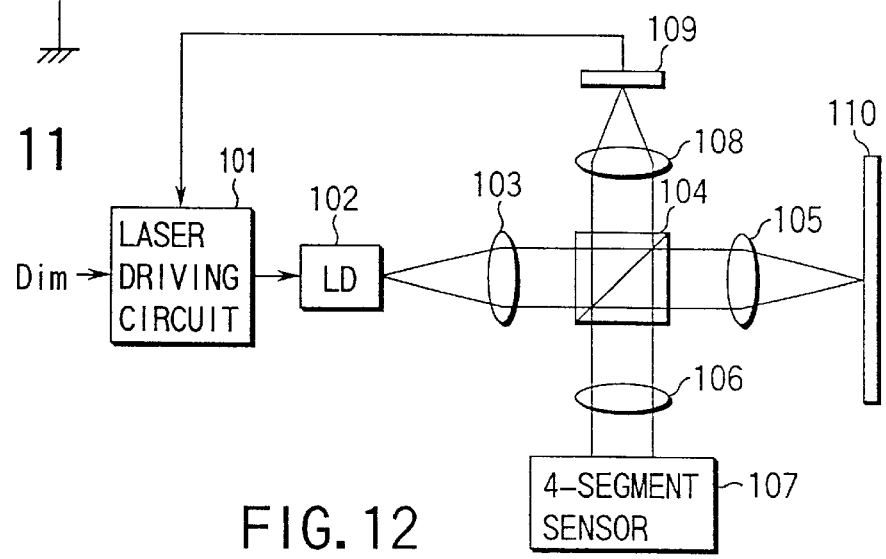
FIG. 12 is a construction diagram showing one example of a conventional laser driving circuit.

The circuit shown in FIG. 10 is a voltage input type circuit. In the case of a current input type circuit, the resistor $R_L$ may be provided inside the integrated circuit as shown in FIG. 11. In this case, the input current is subjected to the current/current conversion according to the ratio of the internal resistances.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A laser driving circuit comprising:

a first amplifier for comparing an input signal which controls a light emission intensity of a semiconductor laser with a monitor signal obtained by monitoring a driving current of the semiconductor laser and effecting the control operation to make the input signal and the monitor signal substantially equal to each other;

a second amplifier connected to an output terminal of said first amplifier;

an adder circuit for adding together output signals of said first and second amplifiers;

a driving current generating circuit having an input terminal supplied with an output signal of said adder circuit and an output terminal configured to be connected to the semiconductor laser, for generating a driving current of the semiconductor laser according to the output signal of said adder circuit; and a terminal to which a resistor for detecting the driving current output from said driving current generating circuit and generating the monitor signal is connected.

2. A circuit according to claim 1, wherein said driving current generating circuit has first and second transistors whose bases and emitters are commonly connected respectively and which output the driving current, said second transistor being configured to be connected to the semiconductor laser.

3. A circuit according to claim 1, further comprising a voltage/current converting circuit connected to said first amplifier, for converting a voltage used as the input signal to a current.

4. A circuit according to claim 1, further comprising a compensation circuit connected to said adder circuit, for compensating for a variation in the driving current generated from said driving current generating circuit.

5. A circuit according to claim 4, wherein said compensation circuit includes a reference voltage generating circuit for generating a base-emitter voltage of a transistor constructing said driving current generating circuit; an operational amplifier to which a voltage generated from said reference voltage generating circuit and a voltage supplied to said adder circuit are supplied, for effecting the control operation to make the supplied voltages substantially equal to each other; and a transistor for controlling a voltage to be supplied to said adder circuit according to an output signal of said operational amplifier.

6. A circuit according to claim 2, wherein said semiconductor laser is connected to the emitter of said second transistor and said terminal and resistor are connected to a collector thereof.

7. A circuit according to claim 2, wherein a load resistor is connected to the emitters of said first and second transistors, said terminal and resistor are connected to a collector of said first transistor and the semiconductor laser is connected to a collector of said second transistor.

8. A laser driving circuit comprising:
a first amplifier for comparing an input signal which controls a light emission intensity of a semiconductor laser with a feedback signal obtained by feeding back a driving current of the semiconductor laser and effecting the control operation to make the input signal and the feedback signal substantially equal to each other;
a second amplifier connected to an output terminal of said first amplifier;
an adder circuit for adding together output signals of said first and second amplifiers;
a driving current generating circuit supplied with an output signal of said adder circuit, for generating the driving current of the semiconductor laser, at least part of the driving current being fed back to said first amplifier as the feedback signal; and
a resistor connected to an input terminal of said first amplifier, for detecting the feedback signal fed back from said driving current generating circuit.

9. A circuit according to claim 8, further comprising a current/current converting circuit connected to said first amplifier, for converting the current value of the input signal to a different current value.

10. A circuit according to claim 8, further comprising a compensation circuit connected to said adder circuit, for compensating for a current of said driving current generating circuit.

11. A circuit according to claim 10, wherein said compensation circuit includes a reference voltage generating circuit for generating a base-emitter voltage of a transistor constructing said driving current generating circuit; an operational amplifier to which a voltage generated from said reference voltage generating circuit and a voltage supplied to said adder circuit are supplied, for effecting the control operation to make the supplied voltages substantially equal to each other; and a transistor for controlling a voltage to be supplied to said adder circuit according to an output signal of said operational amplifier.

12. A circuit according to claim 8, wherein said driving current generating circuit has first and second transistors whose bases and emitters are commonly connected respectively and which output the driving current, said second transistor being configured to be connected to the semiconductor laser.

13. A laser driving circuit comprising:
at least two converting circuits for converting at least two input signals which control a light emission intensity of a semiconductor laser to currents for generating a driving current used for driving the semiconductor laser;
a current mirror circuit having an input terminal supplied with output signals of said at least two converting circuits;
a current switch circuit connected to an output terminal of said current mirror circuit, for eliminating a current which is unnecessary for an operation mode of the semiconductor laser from an output signal of said current mirror circuit according to the operation mode of the semiconductor laser to generate a control current; and
a driving current generating circuit having an input terminal supplied with the control current and an output terminal configured to be connected to the semiconductor laser, for generating the driving current of the semiconductor laser according to the control current.

14. A circuit according to claim 13, wherein said driving current generating circuit includes a first transistor having a base supplied with the control current; a second transistor having a base connected to an emitter of said first transistor; a third transistor having a base connected to an emitter of said second transistor and a collector connected to the base of said first transistor; and a fourth transistor having a base connected to the emitter of said second transistor, an emitter configured to be connected to a resistor and a collector configured to be connected to the semiconductor laser.

15. A circuit according to claim 14, further comprising a first capacitor connected to the base of said first transistor; an oscillation circuit for generating a high-frequency signal; and a second capacitor connected between an output terminal of said oscillation circuit and the base of said first transistor.

16. A circuit according to claim 14, wherein said input signals are current signals, and said resistor is provided inside an integrated circuit.

17. A laser driving circuit comprising:
at least two converting circuits for converting at least two input signals which control a light emission intensity of a semiconductor laser to currents for generating a driving current used for driving the semiconductor laser;
a current switch circuit connected to each output terminal of said at least two converting circuits, for eliminating a current which is unnecessary for an operation mode of the semiconductor laser from sum of output signals of said at least two converting circuits according to the operation mode of the semiconductor laser to generate a control current; and
a driving current generating circuit having an input terminal supplied with the control current and an output terminal configured to be connected to the semiconductor laser, for generating the driving current of the semiconductor laser according to the control current.

18. A circuit according to claim 17, wherein said driving current generating circuit includes a first transistor having a base supplied with the control current; a second transistor having a base connected to an emitter of said first transistor; a third transistor having a base connected to an emitter of said second transistor and a collector connected to the base of said first transistor; and a fourth transistor having a base connected to the emitter of said second transistor, an emitter configured to be connected to a resistor and a collector configured to be connected to the semiconductor laser.

19. A circuit according to claim 18, further comprising a first capacitor connected to the base of said first transistor; an oscillation circuit for generating a high-frequency signal; and a second capacitor connected between an output terminal of said oscillation circuit and the base of said first transistor.

20. A circuit according to claim 18, wherein said input signals are current signals, and said resistor is provided inside an integrated circuit.

* * * * *